(12) United States Patent
Maevskii et al.

(10) Patent No.: US 11,190,213 B2
(45) Date of Patent: Nov. 30, 2021

(54) CODING METHOD, WIRELESS DEVICE, AND CHIP

(71) Applicant: HUAWEI TECHNOLOGIES CO., LTD., Guangdong (CN)

(72) Inventors: Aleksei Eduardovich Maevskii, Moscow (RU); Vladimir Gritsenko, Moscow (RU); Yunfei Qiao, Hangzhou (CN); Jian Wang, Hangzhou (CN); Chaolong Zhang, Hangzhou (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 0 days.

(21) Appl. No.: 16/689,754

(22) Filed: Nov. 20, 2019

(65) Prior Publication Data
US 2020/0091935 A1    Mar. 19, 2020

Related U.S. Application Data

(63) Continuation of application No. PCT/CN2018/091826, filed on Jun. 19, 2018.

(30) Foreign Application Priority Data

Jun. 16, 2017 (CN) .......................... 201710458937.7

(51) Int. Cl.
*H03M 13/00* (2006.01)
*H03M 13/13* (2006.01)

(52) U.S. Cl.
CPC ................................. *H03M 13/13* (2013.01)

(58) Field of Classification Search
CPC .................................................. H03M 13/113
See application file for complete search history.

(56) References Cited

U.S. PATENT DOCUMENTS

| | | | | |
|---|---|---|---|---|
| 6,944,234 B2 * | 9/2005 | Kakura | ................. | H03M 13/39 375/262 |
| 7,363,231 B2 * | 4/2008 | Kikuiri | ................. | G10L 19/022 704/229 |
| 7,746,916 B2 * | 6/2010 | Han | .................... | H04L 27/2613 375/142 |
| 8,558,724 B2 * | 10/2013 | Harada | .................. | H03M 7/40 341/50 |

(Continued)

FOREIGN PATENT DOCUMENTS

| | | |
|---|---|---|
| CN | 101217337 A | 7/2008 |
| CN | 102082635 A | 6/2011 |

(Continued)

OTHER PUBLICATIONS

Chen Kai, "Research on Polar Coding Theory and Practical Applications", China Doctoral Dissertations Full-Text Databse, Apr. 30, 2015(Apr. 30, 2015), with an English abstract, total 152 page.

(Continued)

*Primary Examiner* — Esaw T Abraham
(74) *Attorney, Agent, or Firm* — Womble Bond Dickinson (US) LLP

(57) ABSTRACT

A coding method, a wireless device, and a chip are described. A coding method may include obtaining, based on a sequence whose length is $2^{n'}$, a mother code sequence used for coding, where the sequence whose length is $2^{n'}$ includes $2^{n'}$ sequence numbers, a length of the mother code sequence is $2^n$, the mother code sequence includes $2^n$ sequence numbers, the $2^n$ sequence numbers are some or all of the $2^{n'}$ sequence numbers, n' is a natural number, and n is a natural number less than or equal to n'. The method may also include coding an input to-be-coded bit by using the mother code sequence. According to this method, a system may store one or more long sequences, and then obtain a required mother code sequence from one of the long sequences according to a coding requirement, thereby reducing storage overheads of the system.

20 Claims, 4 Drawing Sheets

(56) References Cited

U.S. PATENT DOCUMENTS

| | | | |
|---|---|---|---|
| 8,627,172 B2* | 1/2014 | Kamiya | H03M 13/1111 714/758 |
| 10,148,289 B2* | 12/2018 | Shen | H04L 1/0057 |
| 10,432,234 B2* | 10/2019 | Wu | H03M 13/6362 |
| 10,700,816 B2* | 6/2020 | Kim | H04L 1/08 |
| 10,742,350 B2* | 8/2020 | Jang | H04L 1/0068 |
| 2012/0110406 A1* | 5/2012 | Sun | H04L 1/0071 714/751 |
| 2015/0194987 A1 | 7/2015 | Li et al. | |

FOREIGN PATENT DOCUMENTS

| | | |
|---|---|---|
| CN | 103684477 A | 3/2014 |
| CN | 105122656 A | 12/2015 |
| CN | 106230489 A | 12/2016 |
| EP | 2963829 A1 | 1/2016 |
| WO | 2017097098 A1 | 6/2017 |

OTHER PUBLICATIONS

NTT DOCOMO, "Discussion on construction of Polar codes" 3GPP TSG RAN WG1 Meeting #88, R1-1702850, Athens, Greece Feb. 13-17, 2017, total 9 pages.

Samsung, "Design of a Nested Sequence for Polar Codes" 3GPP TSG RAN WG1 #88bis, R1-1705425, Spokane, WA, Apr. 3-7, 2017, total 7 pages.

Intel Corporation, "Sequence design for Polar codes", 3GPP TSG RAN WG1 Meeting #89, R1- 1708317, Hangzhou, P.R. China May 15-19, 2017, total 2 pages.

* cited by examiner ns or may be stored in a server for
downloading by a user.

CODING METHOD, WIRELESS DEVICE, AND CHIP

CROSS-REFERENCE TO RELATED APPLICATIONS

This application is a continuation of International Application No. PCT/CN2018/091826, filed on Jun. 19, 2018, which claims priority to Chinese Patent Application No. 201710458937.7, filed on Jun. 16, 2017. The disclosures of the aforementioned applications are hereby incorporated by reference in their entireties.

TECHNICAL FIELD

The present disclosure relates to the coding field, and more specifically, to a coding method, a wireless device, and a chip.

BACKGROUND

In a communications system, channel coding is usually used to improve data transmission reliability, so as to ensure communication quality. A polar code is theoretically proved to be a coding manner that can obtain a Shannon capacity and has a simple coding and decoding method. The polar code is a linear block code. A generation matrix of the polar code is $G_N$, and a coding process of the polar code is $x_1^N = u_1^N G_N$, where $u_1^N = (u_1, u_2, K, u_N)$ is a binary row vector, $G_N = F_2^{\otimes (\log_2(N))}$, a length of a mother code sequence is $N = 2^n$, and n is a positive integer $$F_2 = \begin{bmatrix} 1 & 0 \\ 1 & 1 \end{bmatrix},$$

and $F_2^{\otimes (\log_2(N))}$ is a Kronecker product of $F_2$ and is defined as $F^{\otimes (\log_2(N))} = F \otimes F^{\otimes (\log_2(N))-1}$.

In a polar code coding process, some bits in $u_1^N$ are used to carry information and are referred to as information bits. A set of sequence numbers of the information bits is denoted as A. The other bits are set to fixed values on which a transmit end and a receive end are agreed in advance and are referred to as fixed bits. A set of sequence numbers of these fixed bits is denoted as a complementary set AC of A. Generally, these fixed bits are set to 0. Actually, a fixed bit sequence may be randomly set provided that the transmit end and the receive end reach an agreement in advance. Therefore, a coding bit sequence of the polar code may be obtained by using the following method: $x_1^N = u_A G_N(A)$, where $u_A$ is a set of information bits in $u_1^N$, and $u_A$ is a row vector whose length is K, that is, $|A|=K$; and $|.|$ represents a quantity of elements in a set, that is, K represents a quantity of elements in the set A; $G_N(A)$ is a submatrix obtained by using rows in the matrix $G_N$ that correspond to indexes in the set A; and $G_N(A)$ is a K×N matrix. According to a cyclic redundancy check (CRC)-assisted enhanced successive-cancellation (SC) decoding algorithm, the polar code may obtain frame error rate (FER) performance better than that of a low density parity-check (LDPC) code and a turbo code.

In the prior approaches, to support all combinations of code lengths and bit rates required by a system, a large quantity of mother code sequences need to be stored. Consequently, storage overheads of the system are extremely high.

SUMMARY

This application provides a coding method, a wireless device, and a chip, to reduce storage overheads of a system.

According to a first aspect, this application provides a coding method, and the method includes:

obtaining, based on a sequence whose length is $2^{n'}$, a mother code sequence used for coding, where the sequence whose length is $2^{n'}$ includes $2^{n'}$ sequence numbers, a length of the mother code sequence is $2^n$, the mother code sequence includes $2^n$ sequence numbers, the $2^n$ sequence numbers are some or all of the $2^{n'}$ sequence numbers, n' is a natural number, and n is a natural number less than or equal to n'; and coding an input to-be-coded bit by using the mother code sequence.

According to a second aspect, this application provides a wireless device, and the wireless device includes at least a memory, an interface, and an encoder.

The memory is configured to store a sequence whose length is $2^{n'}$, where the sequence whose length is $2^{n'}$ includes $2^{n'}$ sequence numbers, and n' is a natural number. The encoder is configured to: obtain an input to-be-coded bit through the interface, and obtain the sequence whose length is $2^{n'}$ from the memory; obtain, based on the sequence whose length is $2^{n'}$, a mother code sequence used for coding, where a length of the mother code sequence is $2^n$, the mother code sequence includes $2^n$ sequence numbers, the $2^n$ sequence numbers are some or all of the $2^{n'}$ sequence numbers, and n is a natural number less than or equal to n'; and code the input to-be-coded bit by using the mother code sequence.

According to a third aspect, this application provides a chip, and the chip includes an interface and an encoder.

The encoder is configured to obtain an input to-be-coded bit through the interface.

The encoder is further configured to: obtain, based on a sequence whose length is $2^{n'}$, a mother code sequence used for coding, where the sequence whose length is $2^{n'}$ includes $2^{n'}$ sequence numbers, a length of the mother code sequence is $2^n$, the mother code sequence includes $2^n$ sequence numbers, the $2^n$ sequence numbers are some or all of the $2^{n'}$ sequence numbers, n' is a natural number, and n is a natural number less than or equal to n'; and code the input to-be-coded bit by using the mother code sequence.

According to a fourth aspect, this application further provides a computer storage medium, the storage medium stores program code, and when the program code is executed by a computer or a processor, the computer or the processor is configured to implement the following steps:

obtaining, based on a sequence whose length is $2^{n'}$, a mother code sequence used for coding, where the sequence whose length is $2^{n'}$ includes $2^{n'}$ sequence numbers, a length of the mother code sequence is $2^n$, the mother code sequence includes $2^n$ sequence numbers, the $2^n$ sequence numbers are some or all of the $2^{n'}$ sequence numbers, n' is a natural number, and n is a natural number less than or equal to n'; and coding an input to-be-coded bit by using the mother code sequence.

According to a fifth aspect, this application further provides a computer program product, the computer program product includes the foregoing program code, and the computer program product may be stored in the storage medium in the fourth aspect, or may be stored in a server for downloading by a user.

In a possible embodiment, n=n'−1, and the obtaining, based on a sequence whose length is $2^{n'}$, a mother code sequence used for coding in the foregoing aspects includes: obtaining the mother code sequence based on an even sequence number or an odd sequence number in the sequence whose length is $2^{n'}$.

In this manner, the mother code sequence used for coding may be quickly obtained from the sequence whose length is 2n', and an algorithm is simple and is easy to implement.

In another possible embodiment, the obtaining, based on a sequence whose length is $2^{n'}$, a mother code sequence used for coding in the foregoing aspects includes: obtaining, based on the sequence whose length is $2^{n'}$, the mother code sequence used for coding, so that any sequence number S' in the mother code sequence meets the following condition:

$$S' = \frac{S+v}{2^{n'-n}},$$

where
S is a sequence number that meets the following condition in the sequence whose length is $2^{n'}$:

$$\text{mod}\left(\frac{S+v}{2^{n'-n}}\right) = 0,$$

where
V is an integer, $-2^{n'-n} < V \leq 0$, and mod is a modulo operator.

This embodiment is applicable to mother code sequences of various lengths. A required mother code sequence can be extracted from the sequence whose length is $2^{n'}$ provided that a length of the mother code sequence is less than or equal to $2^{n'}$.

In another possible embodiment, the obtaining, based on a sequence whose length is $2^{n'}$, a mother code sequence used for coding in the foregoing aspects includes: extracting $2^n$ binary sequence numbers from $2^{n'}$ binary sequence numbers in the sequence whose length is $2^{n'}$, where n'-n bits at fixed locations in each of the $2^n$ binary sequence numbers each are equal to a preset value. The mother code sequence is formed based on remaining bits obtained after the n'-n bits at the fixed locations are removed from each of the $2^n$ binary sequence numbers.

This embodiment is also applicable to mother code sequences of various lengths, and is simpler to implement. For example, the binary sequence number may be selected by using a logic circuit.

Optionally, in the foregoing aspects and embodiments, an order of the $2^n$ sequence numbers of the mother code sequence in the mother code sequence is the same as that in the sequence whose length is $2^{n'}$. Because channels are in a fixed order in the sequence whose length is $2^{n'}$, channels are also in a fixed order in the selected mother code sequence, so that information bits are directly mapped to a high-reliability channel for transmission in subsequent coding.

Optionally, in the foregoing aspects and embodiments, there may be a plurality of different sequences whose lengths are $2^{n'}$, and values of n' corresponding to the sequences are different. When it is determined that a length of a required mother code sequence is $2^n$, a corresponding sequence may be selected from the plurality of sequences, and the mother code sequence used for coding is obtained based on the selected sequence. The memory in the wireless device may store the plurality of different sequences whose lengths are $2^{n'}$ for selecting by an encoder.

When there is only one sequence whose length is $2^{n'}$, the sequence may be referred to as a maximum mother code sequence or a longest sequence. When there are a plurality of sequences whose lengths are $2^{n'}$, the sequences may be referred to as long sequences. In actual application, the sequence may have another name. This is not limited in this application.

According to the technical solutions provided in this application, a system may store one or more long sequences, and then obtain a required mother code sequence from one of the long sequences according to a coding requirement, thereby reducing storage overheads of the system.

DESCRIPTION OF DRAWINGS

To describe the technical solutions in the embodiments of the present invention more clearly, the following briefly introduces the accompanying drawings required for describing the embodiments of the present invention. Apparently, the accompanying drawings in the following description show merely some embodiments of the present invention, and a person of ordinary skill in the art may derive other drawings from these accompanying drawings without creative efforts.

DESCRIPTION OF EMBODIMENTS

The following describes the technical solutions in the embodiments of the present invention with reference to the accompanying drawings in the embodiments of the present invention. Apparently, the described embodiments are merely some rather than all of the embodiments of the present invention. All other embodiments obtained by a person of ordinary skill in the art based on the embodiments of the present invention without creative efforts shall fall within the protection scope of the present invention.

The embodiments of the present invention may be applied to various communications systems, such as a global system for mobile communications (GSM), a code division multiple access (CDMA) system, a wideband code division multiple access (WCDMA) system, a general packet radio service (GPRS) system, a long term evolution (LTE) system, an LTE frequency division duplex (FDD) system, an LTE time division duplex (TDD) system, a universal mobile telecommunication system (UMTS). All information or data coded by a base station or a terminal in the foregoing systems by using a conventional turbo code or low density parity-check (LDPC) code may be coded by using a polar code in the embodiments.

Figure 1:
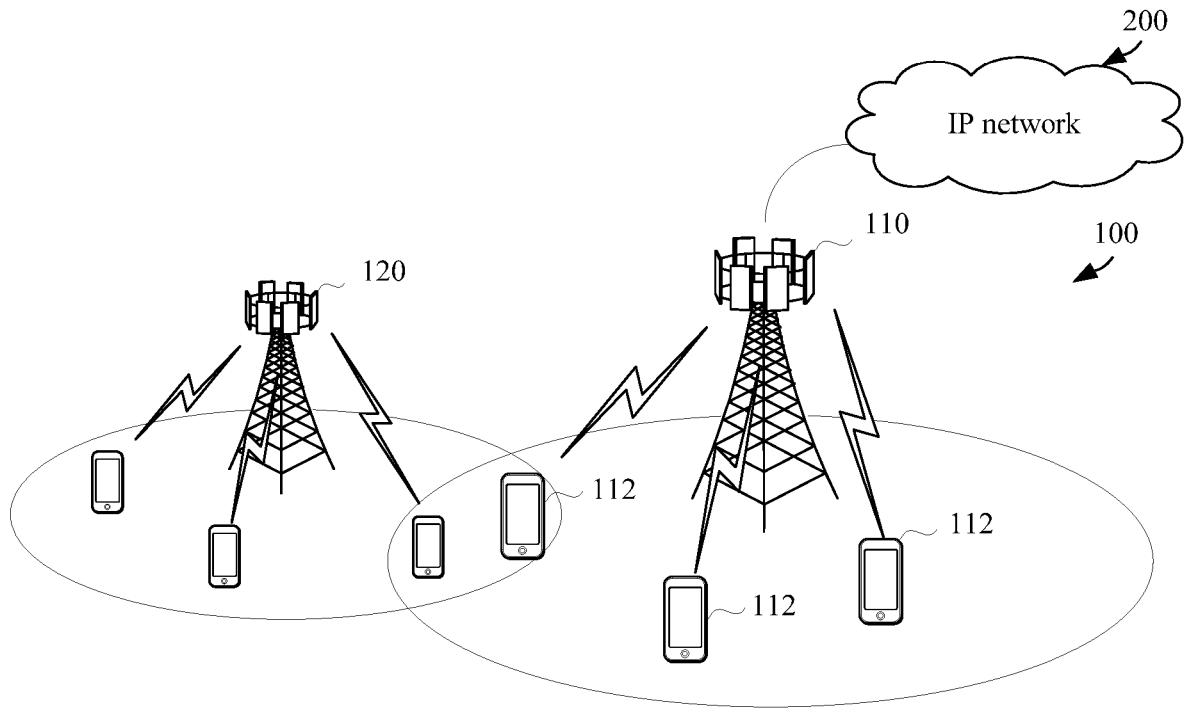
FIG. 1 is a schematic structural diagram of a wireless communications network according to an embodiment of the present invention.

FIG. 1 is a schematic structural diagram of a wireless communications network according to an embodiment of the present invention. FIG. 1 is only an example. Any other wireless network to which a coding method or an apparatus in the embodiments of the present invention can be applied falls within the protection scope of the present invention.

As shown in FIG. 1, a wireless communications network 100 includes a network device 110 and a terminal 112. When the wireless communications network 100 includes a core network, the network device 110 may be further connected to the core network. The network device 101 may further communicate with an internet protocol (IP) network 200, for example, an internet, a private IP network, or another data network. A network device provides a service for a terminal in a coverage area of the network device. For example, referring to FIG. 1, the network device 110 provides wireless access for one or more terminals in a coverage area of the network device 110. In addition, there may be an overlapping area between coverage areas of network devices, for example, network devices 110 and 120. The network devices may further communicate with each other. For example, the network device 110 and the network device 120 may communicate with each other.

The network device may be a device configured to communicate with a terminal device. For example, the network device may be a base transceiver station (BTS) in a GSM system or a CDMA system, or may be a NodeB (NB) in a WCDMA system, or may be an evolved NodeB (eNB or eNodeB) in an LTE system, or a network-side device in a future 5G network. Alternatively, the network device may be a relay station, an access point, a vehicle-mounted device, or the like. In a terminal-to-terminal (D2D) communications system, the network device may further be a terminal functioning as a base station.

The terminal may be user equipment (UE), an access terminal, a subscriber unit, a mobile station, a remote station, a remote terminal, a mobile device, a user terminal, a wireless communications device, a user agent, or a user apparatus. The access terminal may be a cellular phone, a cordless phone, a session initiation protocol (SIP) phone, a wireless local loop (WLL) station, a personal digital assistant (PDA), a handheld device having a wireless communication function, a computing device or another processing device connected to a wireless modem, a vehicle-mounted device, a wearable device, a terminal device in a future first generation wireless communication (5G) network, or the like.

Figure 2:
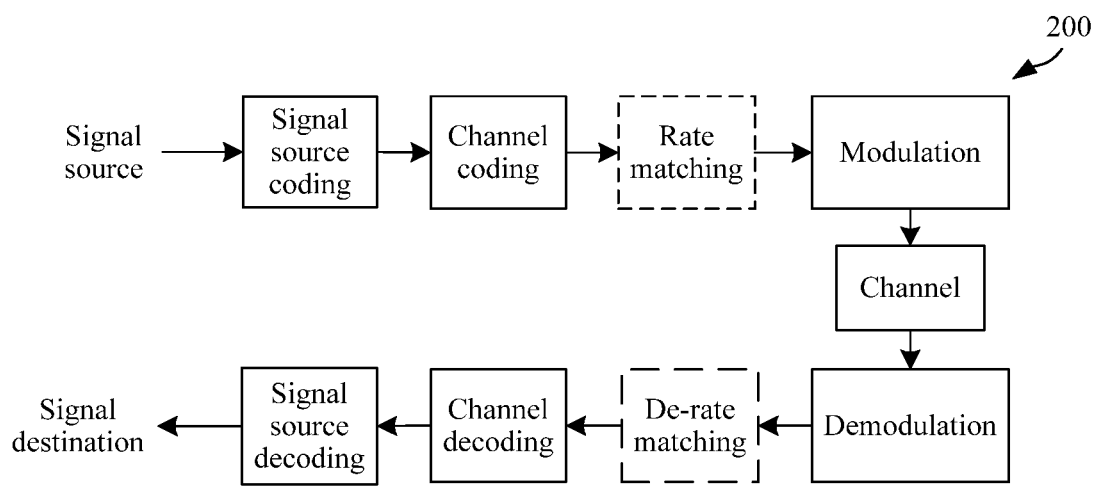
FIG. 2 is a schematic diagram of a coding/decoding procedure according to an embodiment of the present invention.

When the network device communicates with the terminal, the network device/the terminal needs to code to-be-sent data/information according to a procedure shown in FIG. 2, and needs to decode received data/information. For ease of description, the network device and the terminal are collectively referred to as a wireless device below.

Referring to FIG. 2, after obtaining to-be-sent data/information (which may also be referred to as a signal source), a wireless device sequentially performs signal source coding, channel coding, rate matching (optional), and modulation on the to-be-sent data/information, and then sends processed data/information on a channel. After receiving a signal, a peer end obtains final data/information (which may also be referred to as a signal destination) after sequentially performing demodulation, de-rate matching (optional), channel decoding, and signal source decoding.

The embodiments of the present invention relate to channel coding, and descriptions are provided below by using a specific example. It may be learned from the description in the discussion above that a mother code sequence is crucial in a polar coding process, but different code lengths or bit rates correspond to different mother code sequences. Therefore, a plurality of mother code sequences need to be stored for different code lengths or bit rates, causing large consumption of storage space. However, in the embodiments of the present invention, a plurality of mother code sequences may share one sequence whose length is $2^{n'}$, and mother code sequences corresponding to different code lengths or bit rates may be obtained from the sequence whose length is $2^{n'}$. In this way, storage space is greatly reduced.

Figure 3:
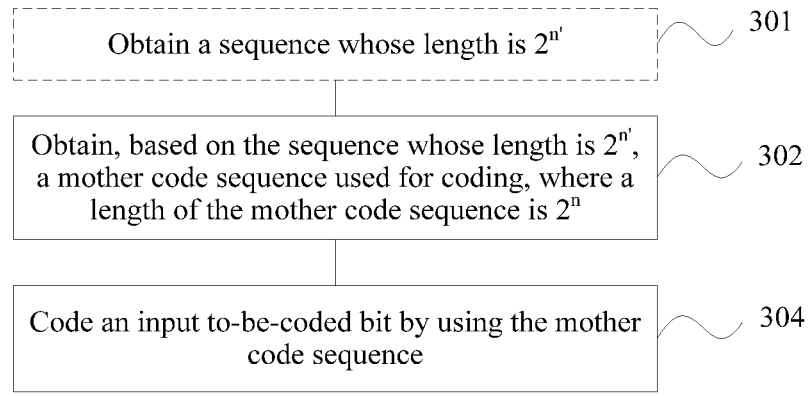
FIG. 3 is a schematic diagram of a coding procedure according to an embodiment of the present invention.

It is assumed that a wireless device pre-stores a sequence whose length is $2^{n'}$ or obtains a sequence whose length is $2^{n'}$ from another device before performing coding, and the sequence whose length is $2^{n'}$ can meet requirements for various code lengths or bit rates. As shown in FIG. 3, assuming that the wireless device needs only a mother code sequence whose length is $2^n$ when performing coding, the coding method in the embodiments of the present invention is as follows.

302. Obtain, based on a sequence whose length is $2^{n'}$, a mother code sequence used for coding, where the sequence whose length is $2^{n'}$ includes $2^{n'}$ sequence numbers, a length of the mother code sequence is $2^n$, the mother code sequence includes $2^n$ sequence numbers, the $2^n$ sequence numbers are some or all of the $2^{n'}$ sequence numbers, n' is a natural number or a positive integer, and n is a natural number or a positive integer less than or equal to n'.

Optionally, when this method is used for channel coding, each of the sequence numbers in this specification is a sequence number of a channel. The $2^{n'}$ sequence numbers in the sequence whose length is $2^{n'}$ may be in a specific sequence.

304. Code an input to-be-coded bit by using the mother code sequence.

Optionally, before step 302, the method may further include the following step: 301. Obtain the sequence whose length is $2^{n'}$. If there are a plurality of sequences of different lengths for selection, that is, the sequence whose length is $2^{n'}$ is one of the plurality of sequences of different lengths, step 301 may alternatively be obtaining the sequence whose length is $2^{n'}$ from the plurality of sequences of different lengths.

The wireless device may be a network device or a terminal. For the terminal, the sequence whose length is $2^{n'}$ may be pre-stored in an internal memory of the terminal, or may be obtained from an access network device when the terminal accesses a network or after the terminal accesses a network. For an access network device, the sequence whose length is $2^{n'}$ may be pre-stored in an internal memory of the access network device, or may be obtained by the access network device from another network device.

A protocol may specify that there is only one sequence whose length is $2^{n'}$, namely, a maximum mother code sequence. All mother code sequences can be obtained from the maximum mother code sequence whose length is $2^{n'}$. The protocol may alternatively specify that there are several sequences of different lengths, that is, values of n' of different sequences are different. The sequence whose length is $2^{n'}$ mentioned above may be one of the plurality of sequences of different lengths. Only some mother code sequences may be obtained from a sequence of a specific length, and the other mother code sequences may be obtained from a sequence of another length.

In the sequence whose length is $2^{n'}$ mentioned above, channel reliability may be obtained by using a method based on density evolution, Gaussian approximation, linear fitting, channel polarization weight (PW) calculation, or the like, and a channel sequence number set is obtained after channel reliability is sorted in descending order or in ascending order. In the sequence whose length is $2^{n'}$, a channel sequence number set with a specific order may alternatively be obtained by using another method, for example, obtained through offline search. The mother code sequence may be a Q sequence or another type of sequence.

In addition to the manners mentioned above, the sequence whose length is $2^{n'}$ may be obtained in many other manners. Because the present invention does not focus on the obtaining manner, details are not described herein.

The sequence whose length is $2^{n'}$ may be pre-stored in the wireless device, or may be obtained by the wireless device from another device. For example, when the wireless device is a terminal, the terminal may obtain the sequence whose length is $2^{n'}$ from a network device before performing coding. When the wireless device is a network device, the network device may obtain the sequence whose length is $2^{n'}$ from another network device (for example, a control device, a core network device, or another network device) before performing coding.

If a length of a mother code sequence required in actual coding is exactly $2^{n'}$, that is, n=n', step 302 is not required, and coding may be directly performed by using the sequence whose length is $2^{n'}$ in step 304. The sequence whose length is $2^{n'}$ is one or more sequences that are designed in consideration of a plurality of code lengths and/or bit rates, and a length of a mother code sequence used in actual coding may be usually shorter than the length of the sequence whose length is $2^{n'}$. Therefore, several methods for obtaining, from the sequence whose length is $2^{n'}$, the mother code sequence that needs to be used in actual coding are further designed in the embodiments of the present invention.

Assuming that a length of a mother code sequence required by the wireless device is $2^n$, the wireless device may obtain, by using any one of the following embodiments, the mother code sequence whose length is $2^n$ from a long sequence whose length is $2^{n'}$.

Embodiment 1

When n=n'−1, the mother code sequence may be obtained based on an even sequence number or an odd sequence number in the sequence whose length is $2^{n'}$.

Manner 1: The mother code sequence may be obtained based on an even sequence number in the sequence whose length is $2^{n'}$.

Assuming that any sequence number in the mother code sequence is S', and any even sequence number in the sequence whose length is $2^{n'}$ is Se, $$S' = \frac{Se}{2}.$$

Manner 2: The mother code sequence may alternatively be obtained based on an odd sequence number in the sequence whose length is $2^{n'}$.

Assuming that any sequence number in the mother code sequence is S', and any odd sequence number in the sequence whose length is $2^{n'}$ is So, $$S' = \frac{So - 1}{2}.$$

Figure 4A:
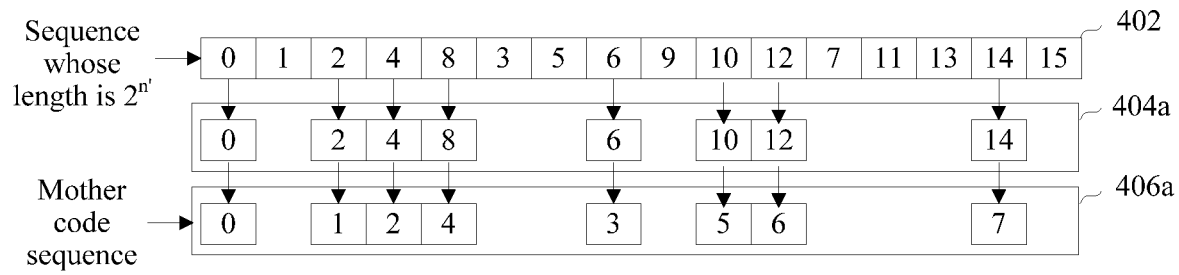
FIG. 4(a) is a schematic diagram of a mother code obtaining method according to an embodiment of the present invention.

For example, referring to FIG. 4(a), it is assumed that n'=4, and the sequence whose length is $2^{n'}$ obtained by the wireless device is 402 in FIG. 4(a), that is, {0, 1, 2, 4, 8, 3, 5, 6, 9, 10, 12, 7, 11, 13, 14, 15}.

If n=n'−1=3, the wireless device may extract even sequence numbers {0, 2, 4, 8, 6, 10, 12, 14} (as shown in 404a in FIG. 4(a)) from the sequence whose length is $2^{n'}$ to form the mother code sequence. Assuming that any sequence number in the mother code sequence is S', and any even sequence number in the sequence whose length is $2^{n'}$ is Se, $$S' = \frac{Se}{2}.$$

A finally formed mother code sequence is shown in 406a in FIG. 4(a), and is {0, 1, 2, 4, 3, 5, 6, 7}.

Figure 4B:
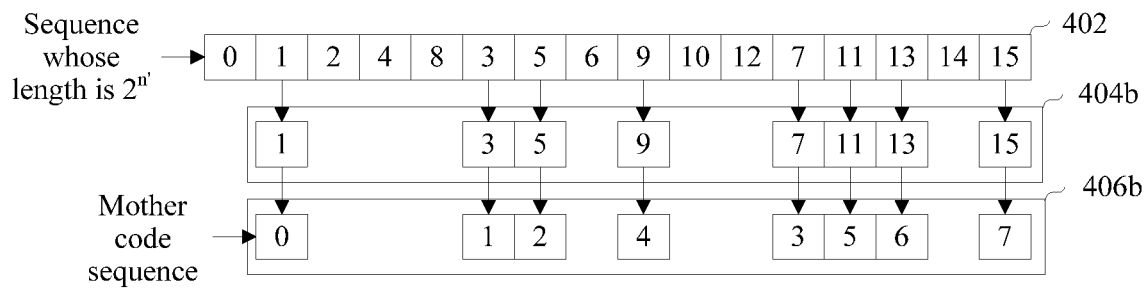
FIG. 4(b) is a schematic diagram of another mother code obtaining method according to an embodiment of the present invention.

Referring to FIG. 4(b), the sequence whose length is $2^{n'}$ is still used as an example. Odd sequence numbers {1, 3, 5, 9, 7, 11, 13, 15} (as shown in 404b in FIG. 4(b)) may be extracted from the sequence whose length is $2^{n'}$ to form the mother code sequence used for coding. Assuming that any sequence number in the mother code sequence is S', and any odd sequence number in the sequence whose length is $2^{n'}$ is S, $$S' = \frac{So - 1}{2}.$$

A finally formed mother code sequence is shown in 406b in FIG. 4(b), and is {0, 1, 2, 4, 3, 5, 6, 7}.

Descriptions are provided above by using n'=4 and n=3 as only an example. If a half of a sequence of another length is selected as a mother code sequence, reference may also be made to the foregoing method.

The foregoing embodiment is applicable to only a case of n=n'−1, that is, applicable to several mother code sequences of limited lengths. Therefore, to enable most or all mother code sequences to be obtained from the sequence whose length is $2^{n'}$, another method is required. Another embodiment is used below for description.

Embodiment 2

A difference between Embodiment 2 and Embodiment 1 lies in that Embodiment 2 is applicable to mother code sequences of various lengths.

Assuming that a length of a mother code used for coding is $2^n$, $2^n$ sequence numbers in the mother code sequence may be obtained from the sequence whose length is $2^{n'}$ in the following manner:

The mother code sequence used for coding is obtained based on the sequence whose length is $2^{n'}$, so that any sequence number S' in the mother code sequence meets the following condition:

$$S' = \frac{S + v}{2^{n_{max} - n}},$$

where
S is a sequence number that meets the following condition in the sequence whose length is $2^{n'}$:

$$\mod\left(\frac{S+v}{2^{n'-n}}\right) = 0,$$

where $-2^{n'-n} < V \leq 0$, and mod is a modulo operator.

For ease of understanding, a specific example is used below for description.

For example, it is assumed that n'=4, that is, a sequence whose length is $2^{n'}=16$ is {0, 1, 2, 4, 8, 3, 5, 6, 9, 10, 12, 7, 11, 13, 14, 15}. If a mother code sequence whose length is N=2 is extracted from the sequence, one of the following manners may be used.

(1). When V=−3, the sequence number that meets $$\mod\left(\frac{S+v}{2^{n'-n}}\right) = 0$$

is S=3, 7, 11, and 15, and the sequence number in the mother code sequence is $$S' = \frac{S+v}{2^{n'-n}},$$

that is, a corresponding mother code sequence is {0, 1, 2, 3}.

(2). When V=−2, the sequence number that meets $$\mod\left(\frac{S+v}{2^{n'-n}}\right) = 0$$

is S=2, 6, 10, and 14, and the sequence number in the mother code sequence is $$S' = \frac{S+v}{2^{n'-n}},$$

that is, a corresponding mother code sequence is {0, 1, 2, 3}.

(3). When V=−1, the sequence number that meets $$\mod\left(\frac{S+v}{2^{n'-n}}\right) = 0$$

is S=1, 5, 9 and 13, and the sequence number in the mother code sequence is $$S' = \frac{S+v}{2^{n'-n}},$$

that is, a corresponding mother code sequence is {0, 1, 2, 3}.

(4). When V=0, the sequence number that meets $$\mod\left(\frac{S+v}{2^{n'-n}}\right) = 0$$

is S=0, 4, 8, and 12, and the sequence number in the mother code sequence is $$S' = \frac{S+v}{2^{n'-n}},$$

that is, a corresponding mother code sequence is {0, 1, 2, 3}.

It may be learned from the foregoing description that regardless of a value of V, the finally formed mother code sequences are the same. Certainly, in actual application, the foregoing formula may be slightly transformed, for example, $$S' = \frac{S+v}{2^{n'-n}},$$

and S is a sequence number that meets the following condition in a long sequence:

$$\mod\left(\frac{S-v}{2^{n'-n}}\right) = 0,$$

where $0 < V \leq 2^{n'-n}$.

It should be understood that various variants of the foregoing formula fall within the protection scope of the present invention.

Embodiment 3

Embodiment 3 is also applicable to mother code sequences of various lengths. The $2^n$ sequence numbers in the mother code sequence may be obtained from the sequence whose length is $2^{n'}$ in the following manner.

(1). $2^n$ sequence numbers are extracted from the $2^{n'}$ sequence numbers in the sequence whose length is $2^{n'}$, and n'−n bits at fixed locations in a binary form of each of the $2^n$ sequence numbers each are equal to a preset value. The preset value herein may be one preset value or a plurality of preset values.

For example, each sequence number in the sequence whose length is $2^{n'}$ is represented in a binary form as $x=(x_0, x_1, \ldots x_{n'-1})$. It is assumed that the n'−n bits at the fixed locations are $x_{i_1}, x_{i_2}, \ldots x_{i_{n'-n}}$, and that the preset value is $a_1, a_2, \ldots, a_{n'-n}$, where $a_t=0$ or 1, and $1 \leq t \leq n'-n$. In other words, $2^N$ binary sequence numbers that meet the following condition need to be selected from the sequence whose length is $2^{n'}$, to form the mother code sequence:

$x_{i_1}=a_1, x_{i_2}=a_2, \ldots x_{i_{n'-n}}=a_{n'-n}$.

Certainly, in actual application, there may be one preset value, for example, 0 or 1, that is, values of $a_1, a_2, \ldots, a_{n'-n}$ are the same. Alternatively, there may be two preset values, for example, 0 and 1, that is, some of $a_1, a_2, \ldots,$ n'−n are 0, and the other some of $a_1, a_2, \ldots, a_{n'-n}$ are 1. Alternatively, there may be a plurality of preset values, that is, a preset value is set for each of the n'−n bits at the fixed locations.

(2). The mother code sequence is formed based on a sequence represented by using remaining bits obtained after the n'−n bits at the fixed locations are removed from the binary form of each of the $2^n$ sequence numbers.

For ease of understanding, Embodiment 3 is described below by using a specific example.

Figure 5:
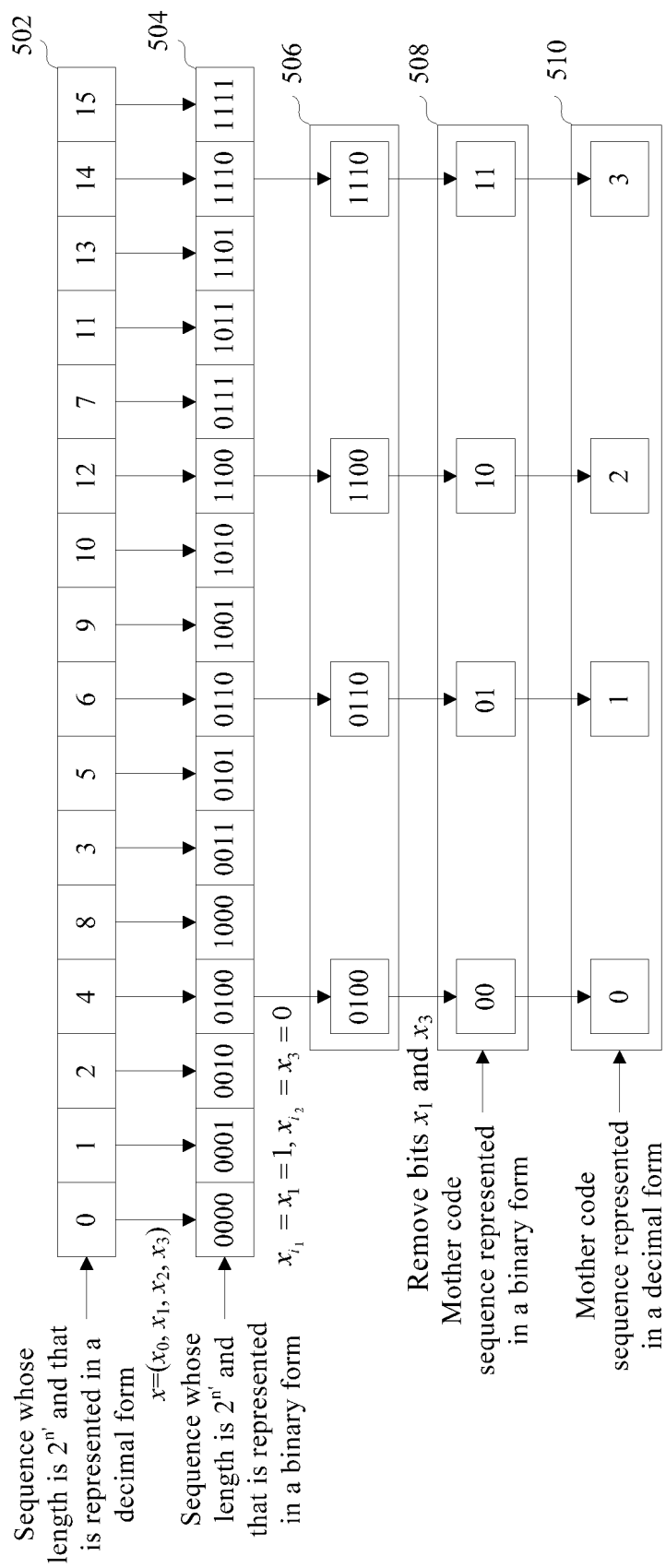
FIG. 5 is a schematic diagram of a mother code obtaining method according to another embodiment of the present invention.

Referring to 502 shown in FIG. 5, it is assumed that n'=4, and a sequence whose length is $2^{n'}=16$ is represented in a decimal form as {0, 1, 2, 4, 8, 3, 5, 6, 9, 10, 12, 7, 11, 13, 14, 15}. If sequence numbers in the sequence whose length is $2^{n'}$ are represented in a binary form, reference may be made to 504 in FIG. 5.

It is assumed that a length of the mother code sequence used for coding is $2^n=4$, that is, n=2. If the mother code sequence used for coding is obtained from the sequence whose length is $2^{n'}$, the following manner may be used.

1. Four ($2^n$) binary sequence numbers whose 2(n'−n=2) bits ($x_{i_1}, x_{i_2}$) at fixed locations each are equal to the preset value are selected from $2^{n'}$ binary sequence numbers in the sequence whose length is $2^{n'}$.

For example, it is assumed that two bits at the fixed locations are respectively the second bit (that is, $x_{i_1}=x_1$) and the fourth bit (that is, $x_{i_2}=x_3$), and that there are two preset values $a_1=1$ and $a_2=0$. To be specific, a selection condition is $x_{i_1}=x_1=1$ and $x_{i_2}=x_3=0$, that is, a binary sequence number whose second bit has a value equal to 1 and whose fourth bit has a value equal to 0 is a binary sequence number that meets the selection condition.

Sequence numbers shown in 506 in FIG. 5 are binary sequence numbers that are selected based on the foregoing condition from the sequence whose length is $2^{n'}$.

(2). The mother code sequence is formed after the two bits at the fixed locations are removed from each of the obtained four binary sequence numbers.

Referring to FIG. 5, after the second bit ($x_1$) and the fourth bit ($x_3$) in 506 are removed, a mother code sequence 508 represented in a binary form is formed. If all sequence numbers in 508 are represented in a decimal form, a mother code sequence {0, 1, 2, 3} represented in a decimal form shown in 510 is formed.

It should be noted that if the sequence whose length is $2^{n'}$ is originally represented in a binary form, 502 and 510 in FIG. 5 are not required.

Embodiment 2 and Embodiment 3 are described by using n'=4 and n=2 as only an example. However, this embodiment of this application is not limited thereto. Provided that a mother code sequence whose length is $2^n$ is obtained based on a sequence whose length is $2^{n'}$, reference may be made to the foregoing method. For brevity, examples are not listed one by one herein.

Optionally, an order of the $2^n$ sequence numbers of the mother code sequence in the mother code sequence described in Embodiment 1 to Embodiment 3 is the same as that in the sequence whose length is $2^{n'}$. The same order herein means a same relative sequence or a same sequence between the sequence numbers.

The polar coding method according to the embodiments of the present invention is described above in detail above with reference to FIG. 1 to FIG. 5. The wireless device mentioned in the foregoing embodiments is described below with reference to FIG. 6.

Figure 6:
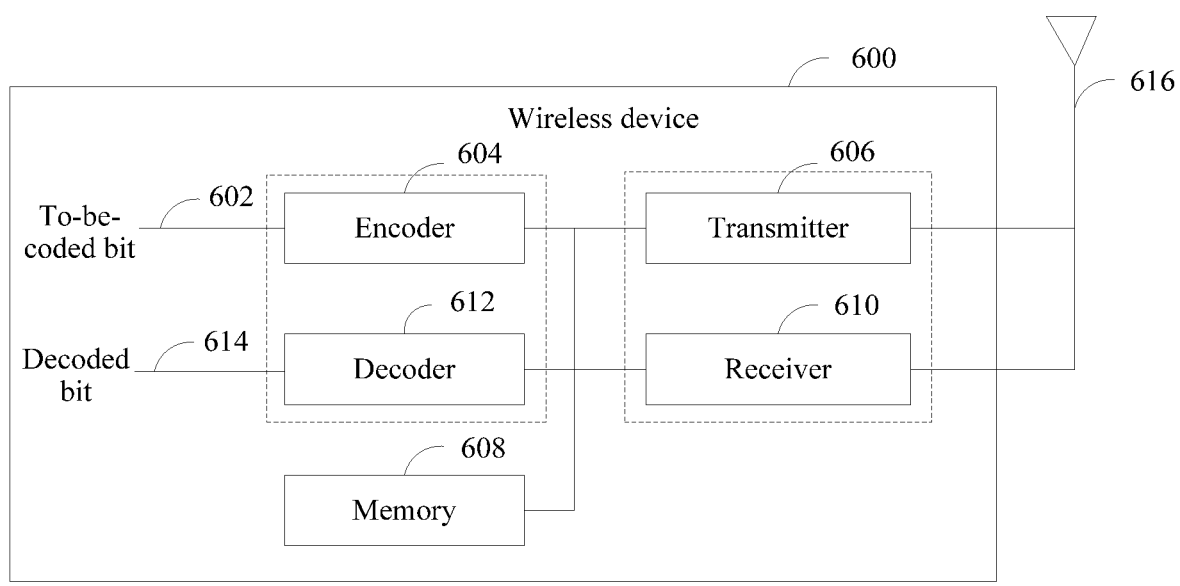
FIG. 6 is a schematic structural diagram of a wireless device according to an embodiment of the present invention.

FIG. 6 is a schematic block diagram of a wireless device according to an embodiment of the present invention. As shown in FIG. 6, a wireless device 600 includes at least an encoder 604 and a memory 608.

The memory 608 is configured to store a sequence whose length is $2^{n'}$.

For a manner of obtaining the sequence whose length is $2^{n'}$, refer to the description in the foregoing method embodiment.

The encoder 604 is configured to: obtain an input to-be-coded bit through an interface 602, obtain the sequence whose length is $2^{n'}$ from the memory 608, and perform steps 302 to 304 or steps 301 to 304.

A function of the encoder 604 may be implemented by using a chip or an integrated circuit. If the function is implemented by using the chip, the wireless device 600 may further include the interface 602. The encoder 604 is configured to: obtain the input to-be-coded bit through the interface 602, obtain the sequence whose length is $2^{n'}$ from the memory 608, and perform the steps 302 to 304 or the steps 301 to 304.

When performing steps 302 to 304 or steps 301 to 304, the chip may implement the steps by using a logic circuit, or by using a processor, or implement some steps by using a logic circuit and implement the other steps by using a processor. If the steps are implemented by using the processor, the memory 608 may store program code used to implement some or all of the steps 302 to 304 or the steps 301 to 304. When running the program code, the processor performs some or all of the steps 302 to 304 or the steps 301 to 304. The memory 608 may be integrated inside the chip, or may be disposed outside the chip.

For how to obtain a mother code sequence whose length is $2^n$ from the sequence whose length is $2^{n'}$, refer to the foregoing description. Details are not described herein again.

The wireless device 600 may further include a transmitter 606, configured to send a bit obtained after the encoder 604 performs coding.

The wireless device 600 may further include an antenna 616, and the transmitter 606 is configured to send, through the antenna 616, a sequence obtained after the encoder performs coding. If the wireless device is a terminal, the antenna 616 is likely to be integrated into the terminal. If the wireless device is a network device, the antenna 616 may be integrated into the network device, or may be separated from the network device, for example, connected to the network device in a remote manner.

In addition, the wireless device may further include a receiver 610, configured to receive information or data from another wireless device. A decoder 612 is configured to: obtain, based on the sequence whose length is $2^{n'}$ stored in the memory 608, a mother code sequence used by the encoder, decode a to-be-decoded bit by using the mother code sequence, and then output a decoded bit through an interface 614.

In actual application, the encoder 604 and the decoder 612 may be integrated to form a coding/decoding device or a coding/decoding apparatus, and the transmitter 606 and the receiver 610 may be integrated to form a transceiver.

An embodiment of the present invention further provides a chip, and the chip includes at least the interface 602 and the encoder 604.

An embodiment of the present invention further provides a computer storage medium, and the storage medium stores program code used to implement steps 302 to 304 or steps 301 to 304.

The storage medium includes any medium that can store program code, such as a USB flash drive, a removable hard disk, a read-only memory (ROM), a random access memory (RAM), a magnetic disk, or an optical disc.

An embodiment of the present invention further provides a computer program product, and the computer program product includes program code used to implement steps 302 to 304 or steps 301 to 304. The computer program product may be stored in a storage medium or a server for downloading by a user.

A connection relationship between the components or the composition units mentioned in the foregoing embodiments may be directly connected or directly coupled, or may be indirectly connected or indirectly coupled. There may be another component or composition unit between two components or two composition units. Because the another component or composition unit is not particularly related to the solutions in the embodiments of the present invention, the another component or composition unit is not shown in the figure.

In the foregoing embodiments, a wireless device or a wireless communications system only needs to store a long sequence. When performing coding, the wireless device or the wireless communications system reads a mother code sequence with a required length used for coding from the long sequence, thereby reducing storage overheads of the wireless device or the system.

The foregoing descriptions are merely specific embodiments and example implementations of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A coding method, comprising:
obtaining a mother code sequence used for coding from a sequence whose length is $2^{n'}$ wherein the sequence whose length is $2^{n'}$ comprises $2^{n'}$ sequence numbers, a length of the mother code sequence is $2^n$, the mother code sequence comprises $2^n$ sequence numbers, the $2^{n'}$ sequence numbers are a subset of the $2^{n'}$ sequence numbers, n' is a positive integer, and n is a positive integer less than or equal to n'; and
coding an input to-be-coded bit by using the mother code sequence.

2. The method according to claim 1, wherein n=n'−1, and the obtaining, based on the sequence whose length is $2^{n'}$, the mother code sequence used for coding comprises:
obtaining the mother code sequence based on an even sequence number or an odd sequence number in the sequence whose length is $2^{n'}$.

3. The method according to claim 1, wherein the obtaining, based on the sequence whose length is $2^{n'}$, the mother code sequence used for coding comprises:
obtaining, based on the sequence whose length is $2^{n'}$, the mother code sequence used for coding, so that any sequence number S' in the mother code sequence meets the following condition:

$$S' = \frac{S+v}{2^{n'-n}},$$

wherein
S is a sequence number that meets the following condition in the sequence whose length is $2^{n'}$:

$$\mathrm{mod}\left(\frac{S+v}{2^{n'-n}}\right) = 0,$$

wherein
V is an integer, $-2^{n'-n} < V \le 0$, and mod is a modulo operator.

4. The method according to claim 1, wherein the obtaining, based on the sequence whose length is $2^{n'}$, the mother code sequence used for coding comprises:
extracting $2^n$ sequence numbers from the $2^{n'}$ sequence numbers in the sequence whose length is $2^{n'}$, wherein n'−n bits at fixed locations in a binary form of each of the $2^n$ sequence numbers each are equal to a preset value; and wherein
the mother code sequence is formed based on a sequence represented by using remaining bits obtained after the n'−n bits at the fixed locations are removed from the binary form of each of the $2^n$ sequence numbers.

5. The method according to claim 1, wherein an order of the $2^n$ sequence numbers of the mother code sequence in the mother code sequence is the same as that in the sequence whose length is $2^{n'}$.

6. The method according to claim 1, wherein the sequence whose length is $2^{n'}$ is one of a plurality of sequences of different lengths, and before the obtaining, based on the sequence whose length is $2^{n'}$, the mother code sequence used for coding, the method further comprises:
obtaining the sequence whose length is $2^{n'}$ from the plurality of sequences of different lengths.

7. The method according to claim 1, wherein the $2^{n'}$ sequence numbers are sequence numbers of $2^{n'}$ channels, and the sequence whose length is $2^{n'}$ is obtained after the sequence numbers of the $2^{n'}$ channels are sorted based on channel reliability.

8. A wireless device, comprising:
a memory configured to store a sequence whose length is $2^{n'}$, wherein the sequence whose length is $2^{n'}$ comprises $2^{n'}$ sequence numbers, and n' is a positive integer; and
an encoder configured to:
obtain an input to-be-coded bit, and obtain the sequence whose length is $2^{n'}$ from the memory,
obtain a mother code sequence used for coding from a sequence whose length is $2^{n'}$, wherein a length of the mother code sequence is $2^n$, the mother code sequence comprises $2^n$ sequence numbers, the $2^n$ sequence numbers are a subset of the $2^{n'}$ sequence numbers, and n is a positive integer less than or equal to n', and
code the input to-be-coded bit by using the mother code sequence.

9. The wireless device according to claim 8, wherein n=n'−1, and the encoder obtaining, based on the sequence whose length is $2^{n'}$, the mother code sequence used for coding comprises the encoder configured to:
obtain the mother code sequence based on an even sequence number or an odd sequence number in the sequence whose length is $2^{n'}$.

10. The wireless device according to claim 8, wherein that the encoder configured to obtain, based on the sequence whose length is $2^{n'}$, the mother code sequence used for coding comprises the encoder configured to:
obtain, based on the sequence whose length is $2^{n'}$, the mother code sequence used for coding, so that any sequence number S' in the mother code sequence meets the following condition:

$$S' = \frac{S+v}{2^{n'-n}},$$

wherein
S is a sequence number that meets the following condition in the sequence whose length is $2^{n'}$:

$$\mod\left(\frac{S+v}{2^{n'-n}}\right) = 0,$$

wherein

V is an integer, $-2^{n'-n} < V \leq 0$, and mod is a modulo operator.

11. The wireless device according to claim 8, wherein the encoder configured to obtain, based on the sequence whose length is $2^{n'}$, the mother code sequence used for coding comprises the encoder configured to:

extract $2^n$ sequence numbers from the $2^{n'}$ sequence numbers in the sequence whose length is $2^{n'}$, wherein n'-n bits at fixed locations in a binary form of each of the $2^n$ sequence numbers each are equal to a preset value; and wherein the mother code sequence is formed based on a sequence represented by using remaining bits obtained after the n'-n bits at the fixed locations are removed from the binary form of each of the $2^n$ sequence numbers.

12. The wireless device according to claim 8, wherein an order of the $2^n$ sequence numbers of the mother code sequence in the mother code sequence is the same as that in the sequence whose length is $2^{n'}$.

13. The wireless device according to claim 8, wherein the sequence whose length is $2^{n'}$ is one of a plurality of sequences of different lengths, and the encoder is further configured to obtain the sequence whose length is $2^{n'}$ from the plurality of sequences of different lengths.

14. The wireless device according to claim 8, wherein the $2^{n'}$ sequence numbers are sequence numbers of $2^{n'}$ channels, and the sequence whose length is $2^{n'}$ is obtained after the sequence numbers of the $2^{n'}$ channels are sorted based on channel reliability.

15. The wireless device according to claim 8, wherein the wireless device further comprises an interface, and the encoder is configured to obtain the input to-be-coded bit through the interface.

16. A chip, comprising:

an interface; and an encoder configured to:

obtain an input to-be-coded bit through the interface, and obtain a mother code sequence used for coding from a sequence whose length is $2^{n'}$, wherein the sequence whose length is $2^{n'}$ comprises $2^{n'}$ sequence numbers, a length of the mother code sequence is $2^n$, the mother code sequence comprises $2^n$ sequence numbers, the $2^n$ sequence numbers are a subset of the $2^{n'}$ sequence numbers, n' is a positive integer, and n is a positive integer less than or equal to n', and code the input to-be-coded bit by using the mother code sequence.

17. The chip according to claim 16, wherein n=n'-1, and that the encoder is configured to obtain, based on the sequence whose length is $2^{n'}$, the mother code sequence used for coding comprises the encoder configured to:

obtain the mother code sequence based on an even sequence number or an odd sequence number in the sequence whose length is $2^{n'}$.

18. The chip according to claim 16, wherein that the encoder is configured to obtain, based on the sequence whose length is $2^{n'}$, the mother code sequence used for coding comprises the encoder configured to:

obtain, based on the sequence whose length is $2^{n'}$, the mother code sequence used for coding, so that any sequence number S' in the mother code sequence meets the following condition:

$$S' = \frac{S+v}{2^{n'-n}},$$

wherein

S is a sequence number that meets the following condition in the sequence whose length is $2^{n'}$:

$$\mod\left(\frac{S+v}{2^{n'-n}}\right) = 0,$$

wherein

V is an integer, $-2^{n'-n} < V \leq 0$, and mod is a modulo operator.

19. The chip according to claim 16, wherein the encoder configured to obtain, based on the sequence whose length is $2^{n'}$, the mother code sequence used for coding comprises the encoder configured to:

extract $2^n$ sequence numbers from the $2^{n'}$ sequence numbers in the sequence whose length is $2^{n'}$, wherein n'-n bits at fixed locations in a binary form of each of the $2^n$ sequence numbers each are equal to a preset value; and wherein the mother code sequence is formed based on a sequence represented by using remaining bits obtained after the n'-n bits at the fixed locations are removed from the binary form of each of the $2^n$ sequence numbers.

20. The chip according to claim 16, wherein an order of the $2^n$ sequence numbers of the mother code sequence in the mother code sequence is the same as that in the sequence whose length is $2^{n'}$.

* * * * *